(12) United States Patent
Freimann et al.

(10) Patent No.: US 7,133,225 B1
(45) Date of Patent: Nov. 7, 2006

(54) METHOD OF MANUFACTURING AN OPTICAL SYSTEM

(75) Inventors: Rolf Freimann, Aalen (DE); Bernhard Fellner, Aalen (DE); Hans-Guenther Sachs, Aalen (DE); Hartmut Brandenburg, Lauchheim (DE); Bernd Doerband, Aalen (DE); Frank Schillke, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/965,909

(22) Filed: Oct. 18, 2004

(51) Int. Cl.
*G02B 7/02* (2006.01)
*G01B 11/00* (2006.01)
*G01N 23/207* (2006.01)

(52) U.S. Cl. .................. 359/822; 359/819; 378/77; 356/401; 356/450; 356/419

(58) Field of Classification Search ............... 359/822, 359/819; 356/401; 378/77, 206; 369/53.28, 369/44.23
See application file for complete search history.

(56) References Cited

U.S. PATENT DOCUMENTS

| | | | |
|---|---|---|---|
| 2,847,579 A * | 8/1958 | Allen et al. | 378/77 |
| 3,254,560 A * | 6/1966 | Gottesmann | 356/401 |
| 3,304,832 A * | 2/1967 | Lewis et al. | 356/419 |
| 5,742,383 A | 4/1998 | Jeon | |
| 5,940,181 A | 8/1999 | Tsubono et al. | |
| 6,556,304 B1 * | 4/2003 | Shibamoto | 356/450 |
| 6,801,375 B1 * | 10/2004 | Hayashide | 359/819 |
| 6,807,022 B1 * | 10/2004 | Yanowitz | 359/822 |
| 2002/0126589 A1 * | 9/2002 | Osada et al. | 369/44.23 |
| 2005/0185554 A1 * | 8/2005 | Osada et al. | 369/53.28 |
| 2005/0185555 A1 * | 8/2005 | Osada et al. | 369/53.28 |

FOREIGN PATENT DOCUMENTS

| | | |
|---|---|---|
| DE | 196 00 520 A1 | 7/1997 |
| DE | 196 51 737 A1 | 7/1998 |
| JP | 04259839 A | 9/1992 |
| JP | 06109582 A | 4/1994 |
| JP | 08233513 A | 9/1996 |
| JP | 09222380 A | 8/1997 |
| JP | 10002714 A | 1/1998 |
| JP | 11014498 A | 1/1999 |
| JP | 2000230883 A | 8/2000 |
| JP | 2001165807 A | 6/2001 |

OTHER PUBLICATIONS

Robert E. Fischer et al., "Optical System Design", excerpt of Chapter 16, MacGraw-Hill 2000, ISBN 0-07-134916-2, pp. 328-334.
Press Release Hannover Exhibition Mar. 2000 by Kugler GmbH, Salem, Germany "Precision Rotary Table".
Daniel Malacara et al., "Interferogram Evaluation and Wavefront Fitting", Optical Shop Testing, Ed. D. Malacara, Second Edition 1992, pp. 455 to 495, Chapter 13, John Wiley & Sons, Inc., New York.

* cited by examiner

*Primary Examiner*—Loha Ben
(74) *Attorney, Agent, or Firm*—Jones Day

(57) ABSTRACT

A method of manufacturing an optical system comprises assembling an optical element on a mounting frame thereof. The mounting frame is disposed on a rotary table having an axis of rotation, and the mounting frame is adjusted such that a predefined axis of symmetry thereof is parallel to the axis of rotation. The optical element is placed on the mounting frame, and an interferometric measurement of a surface of the optical element is performed. The interferometric measurement is analyzed to arrange the optical element relative to the mounting frame such that a predefined axis of the optical element is parallel to the axis of rotation.

16 Claims, 8 Drawing Sheets

METHOD OF MANUFACTURING AN OPTICAL SYSTEM

BACKGROUND OF THE INVENTION

1. Field of the Invention

The present invention generally relates to a method of manufacturing an optical system. In particular, the invention relates to adjusting lenses and mounting frames of an optical system relative to each other.

2. Brief Description of Related Art

Generally, a performance of an optical system is determined by a quality of optical components, such as lenses and mirrors, comprised by the system and by an accuracy of an alignment of the optical components relative to each other. Typically, the optical elements are made of a glass or other suitable material, and their optical surfaces are processed to have a surface shape corresponding to a specification of the optical system. Thereafter, each optical element is attached to a mounting frame made of metal or other suitable material, wherein the mounting frame provides mechanical attachment means, such as flanges, through-holes and others. Thereafter, the optical system is assembled by attaching the respective mounting frames to each other in such a way that positions, such as distances and orientations, of the optical elements relative to each other conform with the specification of the optical system. Thus, the manufacture of the optical system comprises manufacture of optical elements, manufacture of mounting frames, aligning each optical element relative to its mounting frame and aligning the mounting frames relative to each other. Especially in the field of photolithography, the trend to ever smaller structures of semiconductors places ever higher demands on the quality of the optical imaging systems, and thus on the alignment of the optical elements relative to each other and to respective mounting frames.

SUMMARY OF THE INVENTION

The present invention has been accomplished taking the above problems into consideration.

In view of the above, it is an object of the present invention to provide a method of manufacturing an optical system allowing an improved alignment of optical elements relative to each other and relative to mounting frames thereof.

In order to achieve the above object, the present invention provides a method of manufacturing an optical system, the method comprising attaching an optical element to a mounting frame thereof. The mounting frame has a body portion which may provide a rigid structure of the mounting frame, and a supporting portion which is in contact with the optical element when the optical element is attached to the mounting frame. The body portion of the mounting frame has a predefined axis of symmetry. The predefined axis of symmetry of the body portion may represent, for example, an axis of rotational symmetry of a flange portion of the body portion and an axis of symmetry of an arrangement of attachment means provided by the body portion.

The optical element has a first main optical surface and may have first and second main optical surfaces. For instance, the first main optical surface is a mirror surface if the optical element is a mirror, and the first and second main optical surfaces may form optical lens surfaces if the optical element is a lens. The optical element also has a predefined axis of symmetry. For example, the predefined axis of symmetry may coincide with an axis of symmetry of the first main optical surface. Also, the axis of symmetry may coincide with an axis of symmetry of the first main optical surface and with an axis of rotational symmetry of the second main optical surface. The predefined axis of symmetry of the optical element may also be otherwise chosen by the person of ordinary skill in the art practicing the invention.

The process of attaching the optical element to the mounting frame uses a rotary table having an axis of rotation, and the mounting frame is disposed on the rotary table while the optical element is already in contact with the mounting frame or not yet in contact therewith. Thereafter, a position of the mounting frame relative to the rotary table is adjusted such that the axis of symmetry of the body portion of the mounting frame is substantially parallel to the axis of rotation of the rotary table. Such parallelity of the axis of symmetry of the body portion and the axis of rotation of the rotary table may be determined by rotating the rotary table while measuring a surface location of the body portion relative to some fixed coordinate system. For instance, a mechanical or optical touch probe may be used to determine a distance between a fixed location and a surface portion of the body portion of the mounting frame while rotating the rotary table. The adjustment of the position of the mounting frame on the rotary table and measuring of the position may be iteratively performed until the parallelity condition is sufficiently fulfilled. The accuracy with which the parallelity of the axis of symmetry of the body portion of the mounting frame and the axis of rotation of the rotary table has to be fulfilled can be chosen by the person of ordinary skill in the art practicing the invention depending on the application and, for example, depending on an overall accuracy with which the optical element has to be aligned in the optical system.

The method further comprises placing the optical element on the mounting frame such that it contacts the supporting portions of the mounting frame.

Further, at least one interferometric measurement of the first main optical surface of the optical element is performed while the optical element is placed on the mounting frame. Such interferometric measurement is repeated for plural rotational positions of the rotary table and thus, of the optical element about the axis of rotation of the rotary table. The interferometric measurements are analysed, and a position of the optical element relative to the mounting frame is adjusted according to such analysis such that the axis of symmetry of the optical element is substantially parallel to the axis of rotation of the rotary table. Again, the adjustment of the position of the optical element relative to the mounting frame and the interferometric measurements may be iteratively performed to improve a parallelity condition of the axis of symmetry of the optical element relative to the axis of rotation of the rotary table. Also the accuracy of this parallelity condition may be chosen by the person of ordinary skill in the art practicing in the invention depending on the application and, in particular in dependence of an overall accuracy with which the optical element has to be aligned in the optical system.

Finally, the position of the optical element relative to the mounting frame is sufficiently fixed such that the optical element and the mounting frame may be further included in the optical system without substantially deteriorating the adjustment of the position of the optical element relative to the mounting frame.

In the interferometric measurements, an extended beam of measuring light interacts with the measured surface of the optical element, and the illuminated extended area of the surface is imaged onto a detector and superimposed with reference light to generate an interference pattern. Compared to conventional methods which have used pointing light beams reflected from the measured surface and projected onto a screen, the interferometric measurement of the extended surface area may have an advantage of an improved accuracy. In particular, shape errors of the optical surface may be separated from alignment errors of the optical surface relative to the mounting frame.

According to an exemplary embodiment, the beam of measuring light is incident on and measures an area of the optical surface which is greater than about 50% of a total area of that surface.

According to a further exemplary embodiment, the method further comprises determining a distance between the first axis of symmetry of the body portion of the mounting frame and the second axis of symmetry of the optical element. Such determined information of the distance of the axis of symmetry of the mounting frame and of the axis of symmetry of the optical element may be used in assembling plural optical elements relative to each other, wherein two mounting frames may be mounted relative to each other such that the axis of symmetry of a first mounting frame is displaced relative to an axis of symmetry of a second mounting frame by such a distance that the axis of symmetry of the optical element attached to the first mounting frame coincides with an axis of symmetry of an optical element attached to the second mounting frame.

According to an embodiment herein, also an orientation of the axis of symmetry of the optical element relative to the mounting frame is determined. Such orientation may comprise an orientation of the second axis of symmetry of the optical element relative to the body portion about the first axis of symmetry of the body portion, and an orientation of the first axis of symmetry of the body portion relative to the optical element about the second axis of symmetry of the body portion. Such determined orientations may be advantageously used in assembling plural optical elements relative to each other.

According to an exemplary embodiment, the position of the mounting frame relative to the rotary table is adjusted such that the first axis of symmetry of the body portion of the mounting frame substantially coincides with the axis of rotation of the rotary table.

According to some embodiments of the invention, the first main optical surface which is in contact with the supporting portions of the mounting frame is an optical surface of a spherical shape. It is then possible to displace the optical element relative to the mounting frame without changing a symmetry of the first surface relative to the mounting frame. The displacement of the optical element relative to the mounting frame will have a significant effect only with respect to an orientation of the symmetry of the opposite second surface relative to the mounting frame. In other words, the symmetry of the first optical surface will be invariant with respect to displacements of the optical element while the predefined axis of symmetry of the optical element is adjusted relative to the axis of rotation of the rotary table.

According to an exemplary embodiment herein, the performing of interferometric measurements includes determining a distance of a center of curvature of the first main surface from the axis of rotation of the rotary table. Such distance may be easily determined from analysing the plural interferometric measurements taken at plural rotational positions of the rotary table. The adjusting of the position of the optical element relative to the mounting frame is then further performed in dependence of the determined distance.

According to a further embodiment herein, both the first and second surfaces have a spherical shape, interferometric measurements are performed on both surfaces, distances of the center of curvature of each surface from the axis of rotation are determined, and the adjusting of the position of the optical element relative to the mounting frame is performed such that both distances are substantially the same to obtain an orientation of the predefined axis of symmetry of the optical element relative to the axis of rotation of the rotary table.

BRIEF DESCRIPTION OF THE DRAWINGS

The forgoing as well as other advantageous features of the invention will be more apparent from the following detailed description of exemplary embodiments of the invention with reference to the accompanying drawings, wherein.

DETAILED DESCRIPTION OF EXEMPLARY EMBODIMENTS

Figure 1:
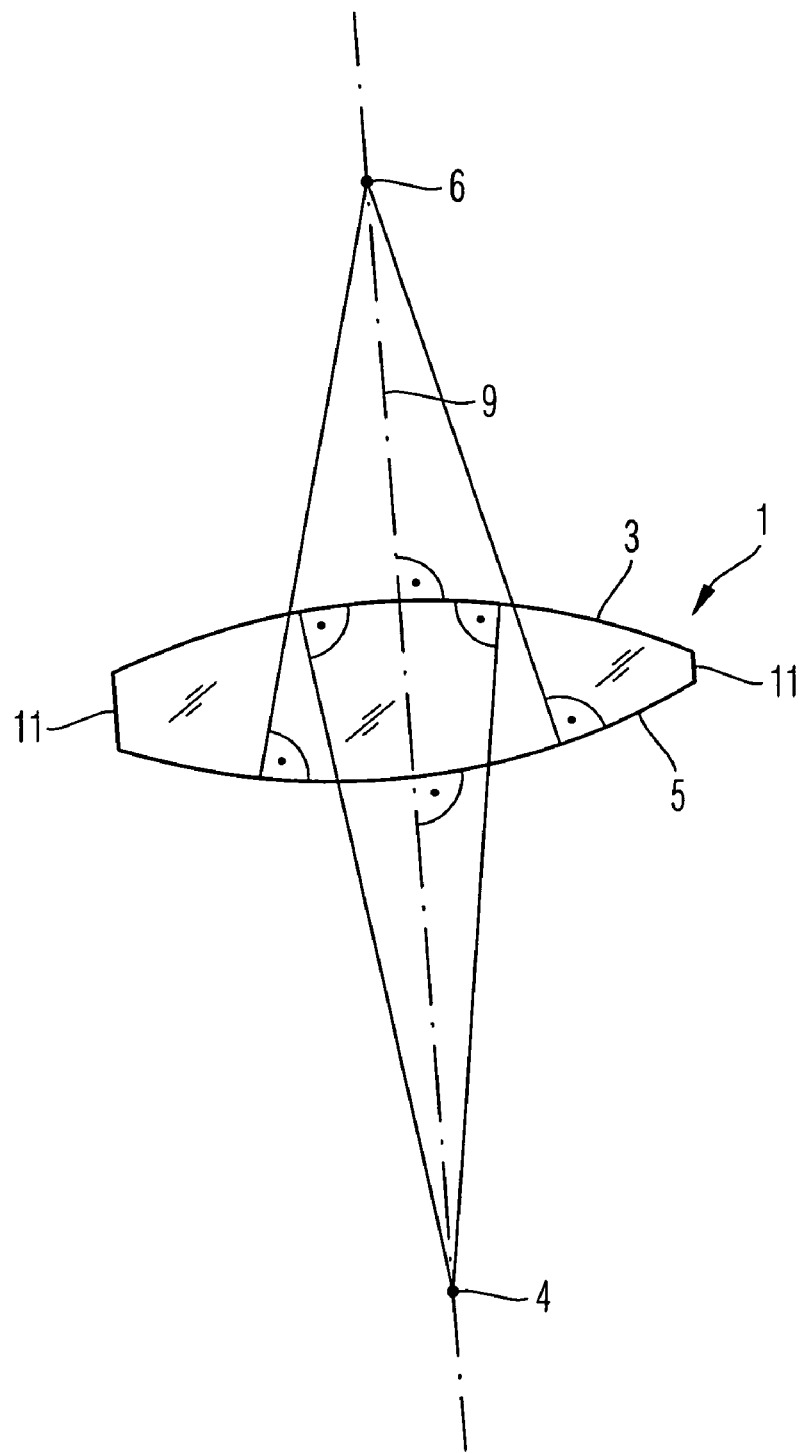
FIG. 1 illustrates an eccentricity of a spherical—spherical lens.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates a lens 1 having a first optical surface 3 and a second optical surface 5. Both optical surfaces 3 and 5 are spherical surfaces such that surface 3 has a center 4 of curvature and surface 5 has a center 6 of curvature. An axis 9 extending through the centers of curvature 4 and 6 is advantageously used as a predefined axis of symmetry of lens 1 even though the complete geometry of lens 1 is not perfectly symmetric with respect to axis 9 as it is apparent from peripheral portions 11 of lens 1.

Figure 2:
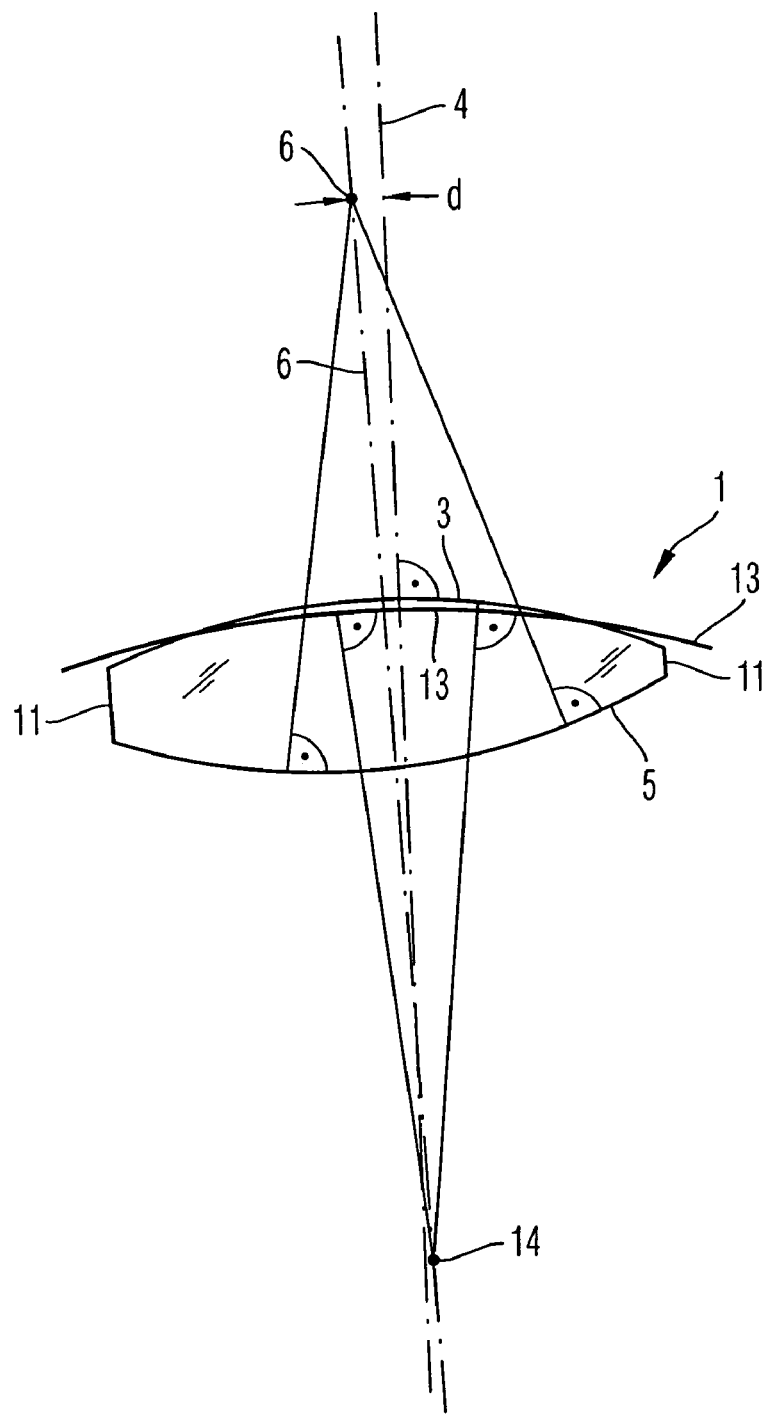
FIG. 2 illustrates an eccentricity of an aspherical-spherical lens.

Similarly, FIG. 2 illustrates a lens 1 having two surfaces 3 and 5, wherein surface 3 has an aspherical shape and surface 5 has a spherical shape. While surface 5 has a center 6 of curvature, a center of curvature may not be associated with aspherical surface 3. However, surface 3 has an axis 4 of rotational symmetry, and generally the center 6 of curvature of surface 5 does not coincide with the axis 4 of symmetry of surface 5. For further assembling lens 1 shown in FIG. 2 with other lenses to a complete optical system, it is of advantage to assign an axis of symmetry to the lens. Such predefined axis of symmetry may coincide with the axis 4 of symmetry of aspherical surface 3, or, depending on the application, such predefined axis 9 may deviate from axis 4 such that the distance d of the center 6 of curvature of surface 5 from axis 4 is taken into account. FIG. 2 illustrates an example of such axis 9 of symmetry which is chosen as follows: Surface 3 has an aspherical shape, and reference numeral 13 in FIG. 2 indicates a best approximating sphere of aspherical surface 3. The best approximating sphere may be determined according to at least squares method applied to deviations of the aspherical surface from its best approximating sphere. A center of curvature of best approximating sphere 13 is indicated at 14 in FIG. 2, and a connecting line between the center 6 of curvature of surface 5 and the center 14 of curvature of the best approximating sphere is selected as the predefined axis 9 of symmetry of optical element 1 for purposes of attaching the lens 1 to a mounting frame as illustrated below.

Figure 3:
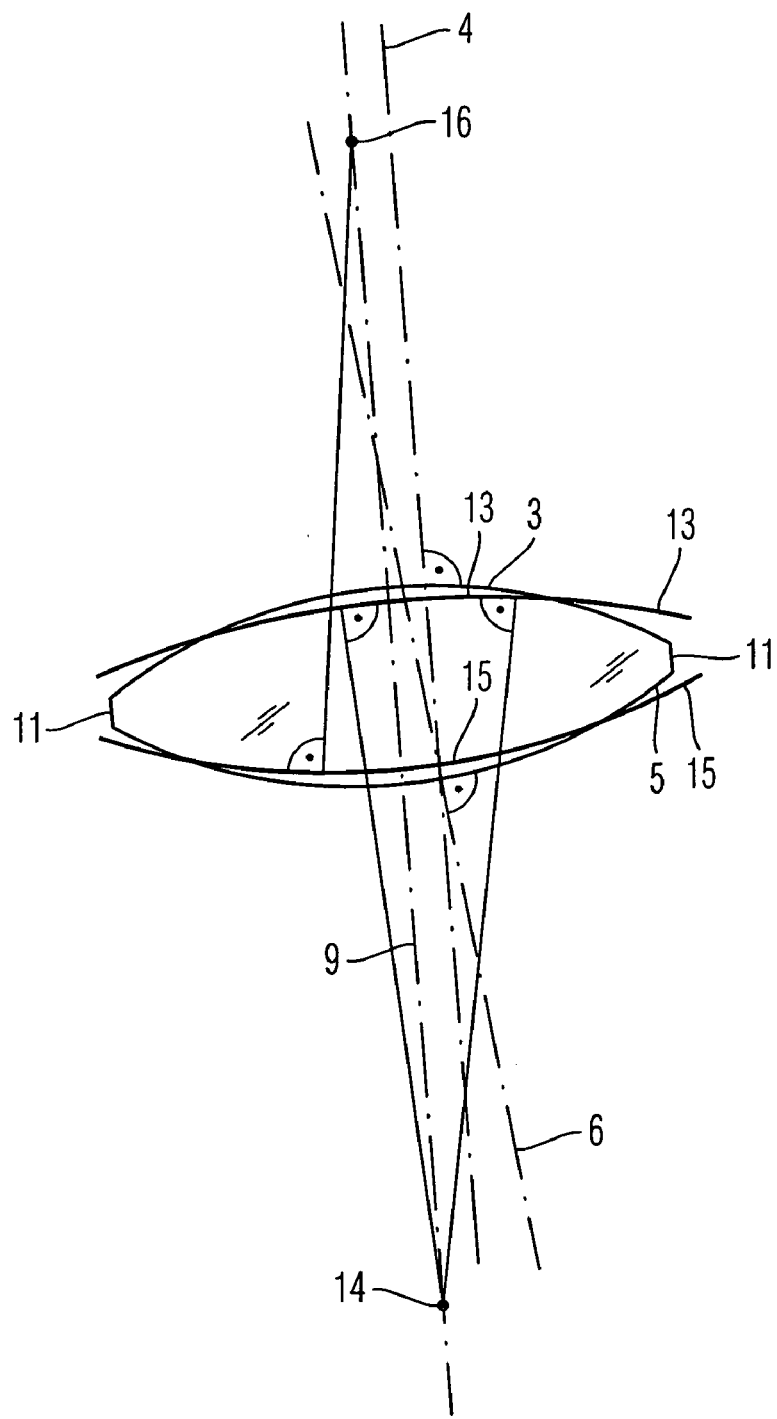
FIG. 3 illustrates an eccentricity of an aspherical—aspherical lens.

Similarly, FIG. 3 illustrates a corresponding situation of a lens 1 having surfaces 3 and 5 which are both aspherical surfaces. Aspherical surface 3 has an axis 4 of rotational symmetry, and surface 5 has an axis 6 of rotational symmetry. Generally, axes 4 and 5 will not coincide. Reference numeral 13 in FIG. 3 indicates a best approximating sphere of surface 3, and reference numeral 15 in FIG. 3 indicates a best approximating sphere 15 of surface 5. A connecting line 9 between centers of curvature 14 and 16 of best approximating spheres 13 and 15, respectively, is used as the predetermined axis of symmetry of lens 1 for the purposes of attaching lens 1 to its mounting frame as illustrated below.

It is to be understood that FIGS. 1 to 3 are exaggerated representations of eccentricities of lenses in that, for instance, the distance d in FIG. 2 of the center 6 of curvature from axis 4 is relatively large. In practice of assembling high quality optics such eccentricities may be only detected with special measuring methods. Examples of such methods are illustrated in JP 92223808 A1, JP 04259839 A1 and JP 2000-230883 A, for example.

Within the context of the present application, an optical surface may be referred to as an aspherical surface if the aspherical surface differs from its best approximating sphere by more than a predetermined criterion. One such criterion is based on a gradient of the difference between the aspherical surface and its best approximating sphere, and the optical surface is referred to as an aspherical surface if such gradient exceeds a value of 6 μm divided by an effective diameter of the optical surface.

Figure 4:
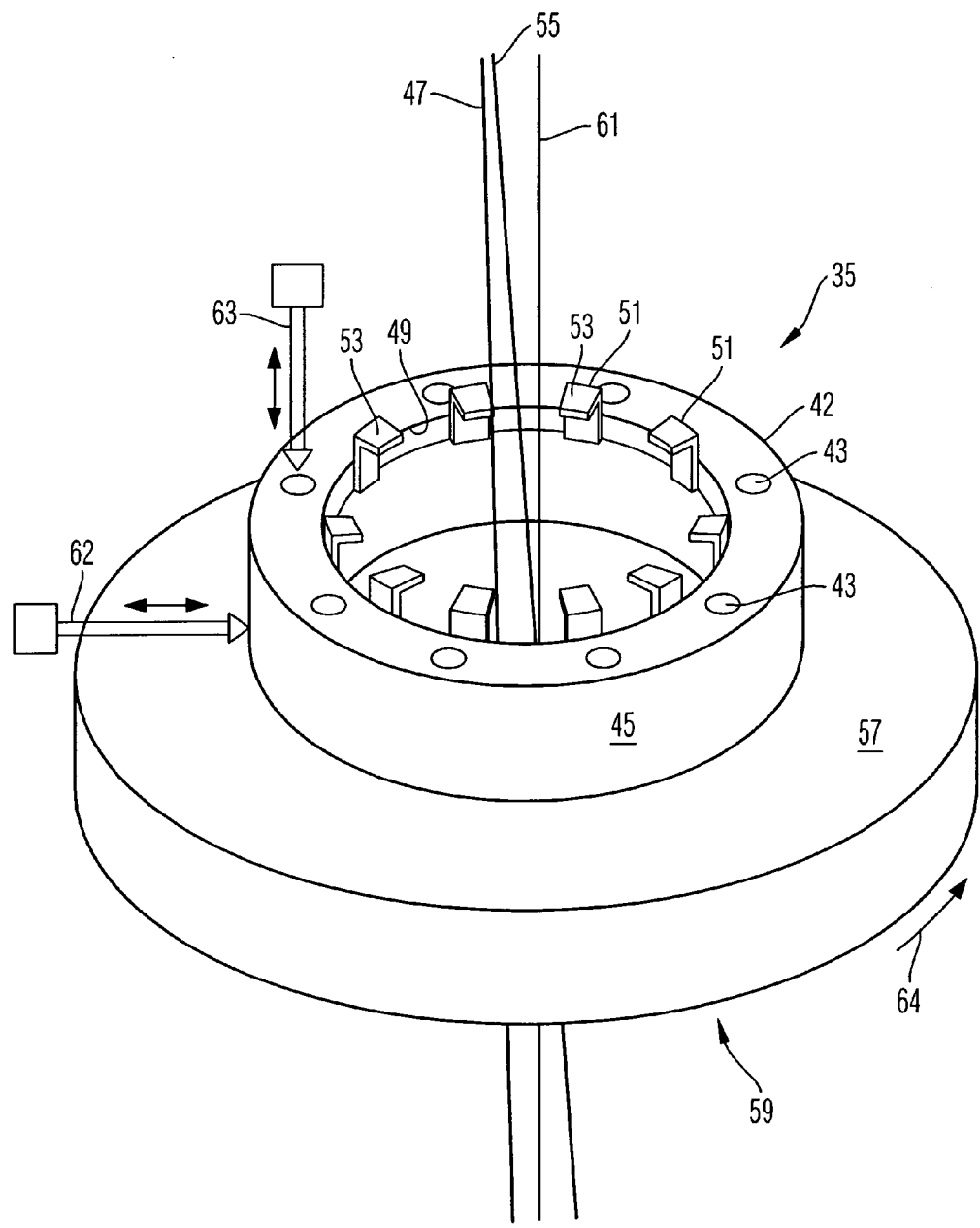
FIG. 4 illustrates a mounting frame for an optical element disposed on a rotary table.

FIG. 4 shows a mounting frame 35 for mounting an optical element 1. Mounting frame 35 comprises a body portion 42 of a cylindrical shape having an outer peripheral surface 45 which is rotationally symmetric with respect to an axis 47 of symmetry. Body portion 42 further comprises an inner flange 49 having a plurality of L-shaped lugs 51 attached thereto. The lugs 51 provide supporting portions 53 for contact with optical element 1 which will be placed on the contact portions 53 in the further process of attaching the optical element to mounting frame 35. Due to a non-perfect manufacture of the mounting frame 35, an axis of symmetry of contact portions 53 does not coincide with the axis 47 of symmetry of body portion 42. The axis of symmetry of the contact portions 53 is indicated with reference numeral 55 in FIG. 4.

The mounting frame 35 is disposed on a top surface 57 of a rotary table 59 having an axis 61 of rotation. Rotary table 59 has an air bearing and is manufactured with a high precision such that an eccentricity is about 100 nm and that an orientation of the axis 61 of rotation is defined by less than 0.1". Such rotary table may be obtained from company Kugler GmbH, Heiligenberger Straße 100, 88682 Salem, Federal Republic of Germany.

Reference numerals 62 and 63 indicate two touch probes which are in contact with the outer peripheral surface 45 of body portion 42 to measure an eccentricity of the body portion 42 relative to the axis 61 of rotation of the rotary table 59 by rotating the table about its rotary axis 61, as indicated by an arrow 64 in FIG. 4, and obtaining readings of touch probes 62, 63 for plural angular positions of the body portion 42 about axis 61.

Thereafter, the position of the mounting frame 35 on the rotary table 59 is adjusted such that the axis 47 of symmetry of the body portion 42 is parallel to the axis 61 of rotation of the table 59. In a preferred embodiment of the invention, the position of the mounting frame 35 is adjusted such that the axis 47 of symmetry of the body portion 42 coincides with the axis 61 of rotation of the table.

As an alternative to the touch probes 61, 62 shown in FIG. 4, other methods can be used to determine an eccentricity of the body portion relative to the axis 61 of rotation. Examples for such methods are an optical touch probe, such as a white light interferometer or others.

Figure 5:
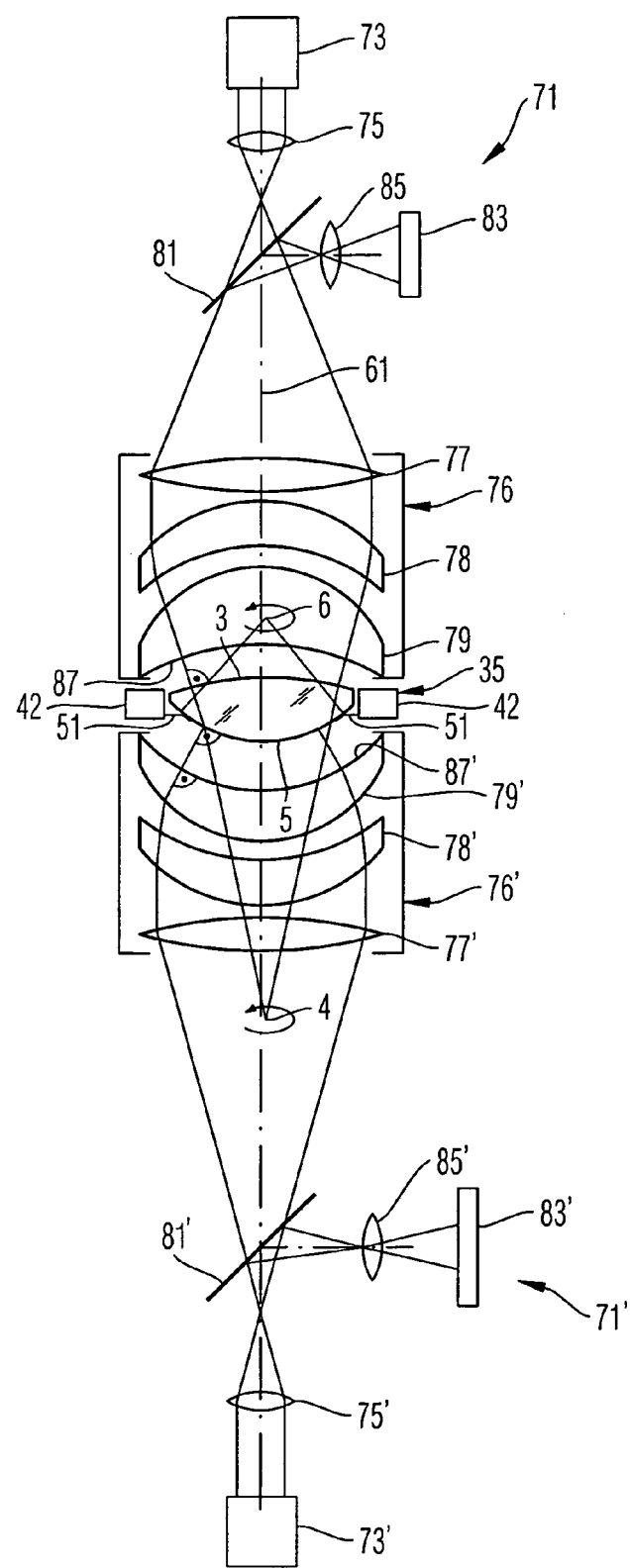
FIG. 5 illustrates an interferometer system used in adjusting the optical element relative to the mounting frame shown in FIG. 4 according to a first embodiment of the invention.

After having adjusted the position of the mounting frame 35 relative to the rotary table 59 as illustrated above, a lens 1 is placed on the supporting portions 53 provided by lugs 51, and interferometric measurements are taken from the lens surfaces with an interferometer system as illustrated in FIG. 5. Both surfaces 3 and 5 of lens 1 are, in this embodiment, spherical surfaces, and surface 5 is in contact with supporting lugs 51 of the mounting frame 35. An interferometer 71 is provided for measuring the upper surface 3 of lens 1. Interferometer 71 comprises a laser light source 73, a collimating optics 75 and an interferometer optics 76 having lenses 77, 78 and 79 generating a beam of measuring light which is orthogonally incident on surface 3 of lens 1. Measuring light reflected from surface 3 travels back the optical path through lenses 79, 78, 77 of the interferometer optics 76 and is reflected from a semitransparent mirror 81 and is incident on an image detector 83 after traversing a camera optics 85. A surface 87 of lens 79 which is opposite to surface 3 to be measured provides a Fizeau surface of the interferometer 71 such that measuring light reflected from Fizeau surface 87 provides reference light which is superimposed with the measuring light reflected from the surface 3 to be measured and to generate an interference pattern on detector 83.

An interferometer 71' is provided for measuring lower surface 5 of lens 1, wherein interferometer 71' has a similar configuration as interferometer 71 for measuring the upper surface 3. Therefore, the components of interferometer 71' are indicated with the same reference numerals as corresponding components of interferometer 71, wherein the components of interferometer 71' are indicated with an apostrophe.

An interferometric measurement of surface 3 is performed with interferometer 71 for plural rotary positions of rotary table 59 about its axis 61 of rotation. Each of the interferometric measurements is analyzed by approximating the optical path differences obtained from the interferograms with Zernike polynomials. Background information relating to interferogram analysis and approximation with Zernike polynomials is available e.g. from Chapter 13 of the textbook of Daniel Malacara, Ed., "Optical Shop Testing", Second Edition, 1992, 455–499, John Wiley & Sons, Inc., New York.

Two Zernike coefficients Z2 and Z3 represent a tilt of surface 3 in x and y directions with respect to an axis of interferometer 71 which does not necessarily coincide with axis 61 of rotation of the rotary table 59. Values of coefficients Z2 and Z3 will vary depending on the angular positions of the rotary table in the plural interferometric measurements.

The value pairs (Z2,Z3) obtained in the plural interferometric measurements are plotted in a Z2-Z3 coordinate system. These values represent a circle in this coordinate system. A Z2'-Z3' coordinate system is chosen such that its origin is in the center of that circle. Vectors (Z2';Z3') represented by the circle in the Z2'Z3' coordinate system have a constant absolute value |(Z2;Z3)|. A distance of the center 4 of curvature of the surface 3 from the axis 61 of rotation of the rotary table may then be calculated by $$r_4 = |(Z2', Z3')| \cdot \frac{2R}{D},$$

wherein
R represents a radius of curvature of surface 3 and
D represents a diameter of the area illuminated by the measuring light of interferometer 71 on surface 3.

Similarly, a distance $r_6$ of center 6 of curvature of surface 5 from the axis 61 of rotation of the rotary table is calculated by performing plural interferometric measurements on surface 5 at plural rotary positions of rotary table 59, using interferometer 71'.

The position of lens 1 on mounting frame 35 is then adjusted such that the obtained values $r_4$ and $r_6$ are substantially the same. This is performed in an iterative process of performing interferometric measurements on both surfaces 3, 5, calculating the corresponding distances $r_4$, $r_6$ and improving the position of the lens 1 on the mounting frame 35.

If, finally, the values of $r_4$ and $r_6$ are substantially the same, this is an indication that the axis 9 of symmetry of lens 1 is oriented substantially parallel to the axis 61 of rotation of the rotary table 59.

Figure 6:
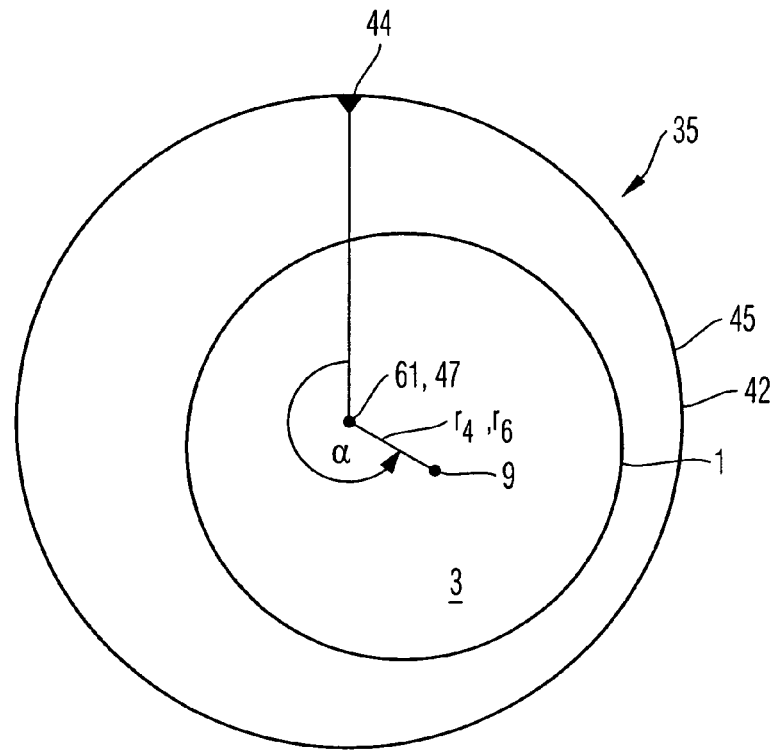
FIG. 6 is an illustration of axes of symmetry of the optical element and mounting frame shown in FIG. 5.

FIG. 6 illustrates an elevational view on lens 1 mounted on the mounting frame 35, wherein an eccentricity is in an exaggerated state. Reference numeral 47 indicates the axis of symmetry of the body portion 42 of mounting frame 35, wherein the mounting frame 35 is adjusted such on the rotary table 59 that the axis 47 coincides with axis 61 of rotation of the rotary table. Reference numeral 9 indicates the axis of symmetry of lens 1, and $r_4$, $r_6$ indicate the respective distance between the center 4, 6 of curvature of surfaces 3, 5 from axis 61 of rotation. Reference numeral 44 in FIG. 6 indicates an alignment mark provided on the body portion 42 of mounting frame 35, and an angle α indicates an orientation of axis 9 of symmetry of lens 1 with respect to mounting frame 35 about its axis 47 of symmetry.

After the position of the lens has been adjusted relative to the mounting frame 35 as illustrated above, the lens 1 is fixed to the supporting lugs 51 of the mounting frame 35 by a method such as gluing, welding, clamping and others.

With the above illustrated method it is possible to attach an optical element to a mounting frame in a reproducible manner such that a predefined axis of symmetry of the optical element is parallel to a predefined axis of the mounting frame and wherein an orientation α and displacement $r_4$ of the axis of the optical element relative to the mounting frame is precisely known.

Figure 7:
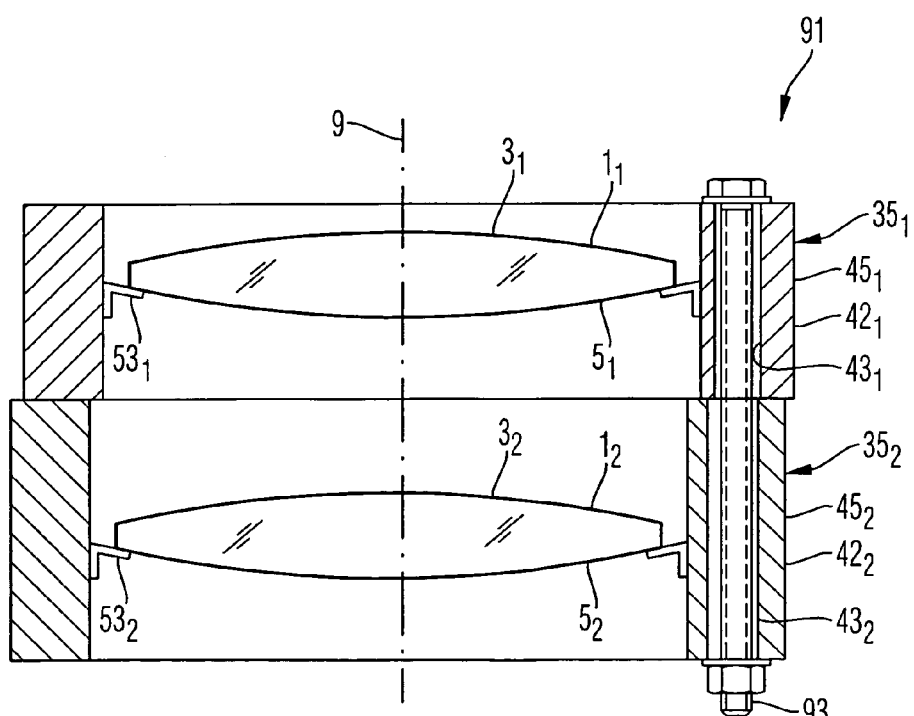
FIG. 7 shows a cross section of an optical system having two optical elements.
Figure 8:
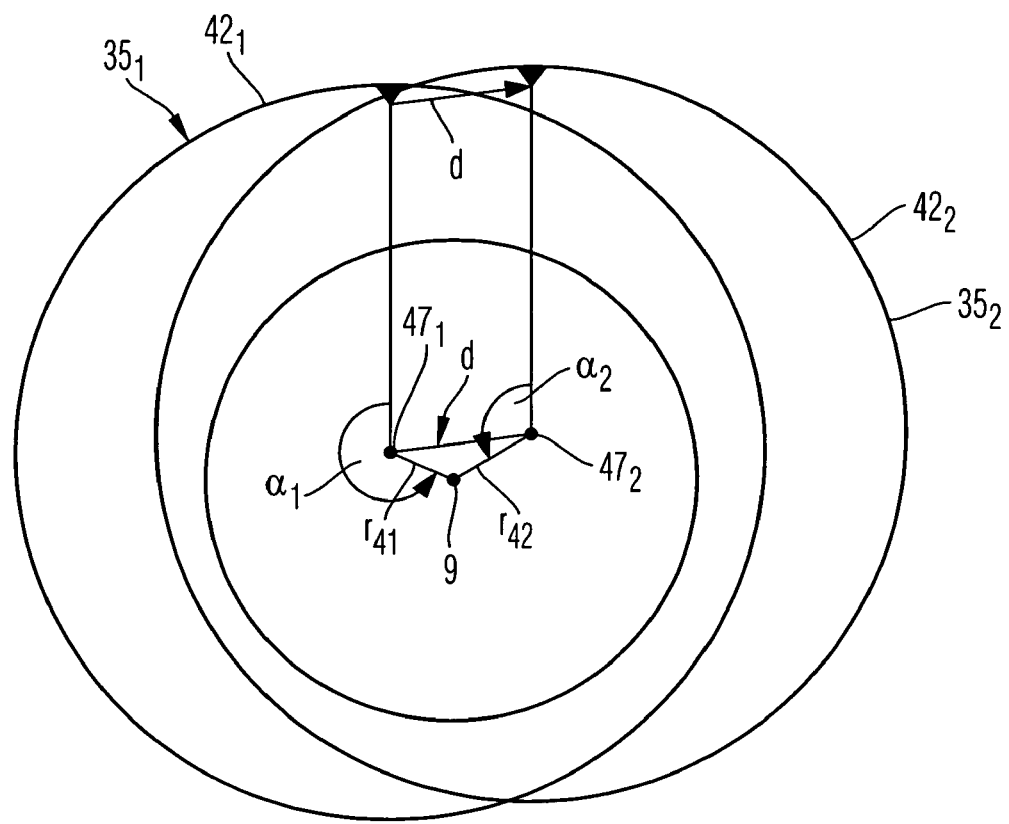
FIG. 8 illustrates axes of symmetry of the optical elements and mounting frames shown in FIG. 7.

FIG. 7 illustrates an optical system 91 comprising two lenses $1_1$ and $1_2$ having coinciding axes 9 of symmetry. For achieving such alignment of the lenses $1_1$, $1_2$, each of the lenses is attached to a respective mounting frame $35_1$, $35_2$ using the alignment method illustrated above. The mounting frames $35_1$, $35_2$ are fixed to each other by plural bolts 93 extending through through-holes $43_1$, $43_2$ of the body portions $42_1$, $42_2$ of the mounting frames. Before fixing the bolts, the mounting frames $35_1$, $35_2$ are adjusted relative to each other as illustrated in FIG. 8. A vector d in FIG. 8 represents a displacement vector between the body portions $42_1$, $42_2$ of the mounting frames 35. The displacement vector d is obtained from the triangle of points $47_1$, $47_2$ and 9. $α_1$ is the orientation of the axis 9 of symmetry of lens $1_1$ relative to body portion $42_1$, the angle $α_2$ represents the orientation of the axis 9 of symmetry of lens $1_2$ relative to body portion $42_2$, $r_{41}$ represents the distance of the axis 9 of symmetry of lens $1_1$ from the axis $47_1$ of symmetry of the body portion $42_1$, and $r_{42}$ represents the distance of the axis of symmetry of lens $1_2$ from the axis $47_2$ of symmetry of body portion $42_2$.

Thus, for assembling the optical system 91 such that the axis of symmetry of lenses $1_1$ and $1_2$ coincide, it is only necessary to adjust the mounting frames $35_1$ and $35_2$ relative to each other such that a displacement vector d as illustrated above is maintained between body portions $42_1$ and $42_2$ of the mounting frames.

It is apparent that with the above illustrated method it is possible to assemble optical systems having more than two lenses.

Figure 9:
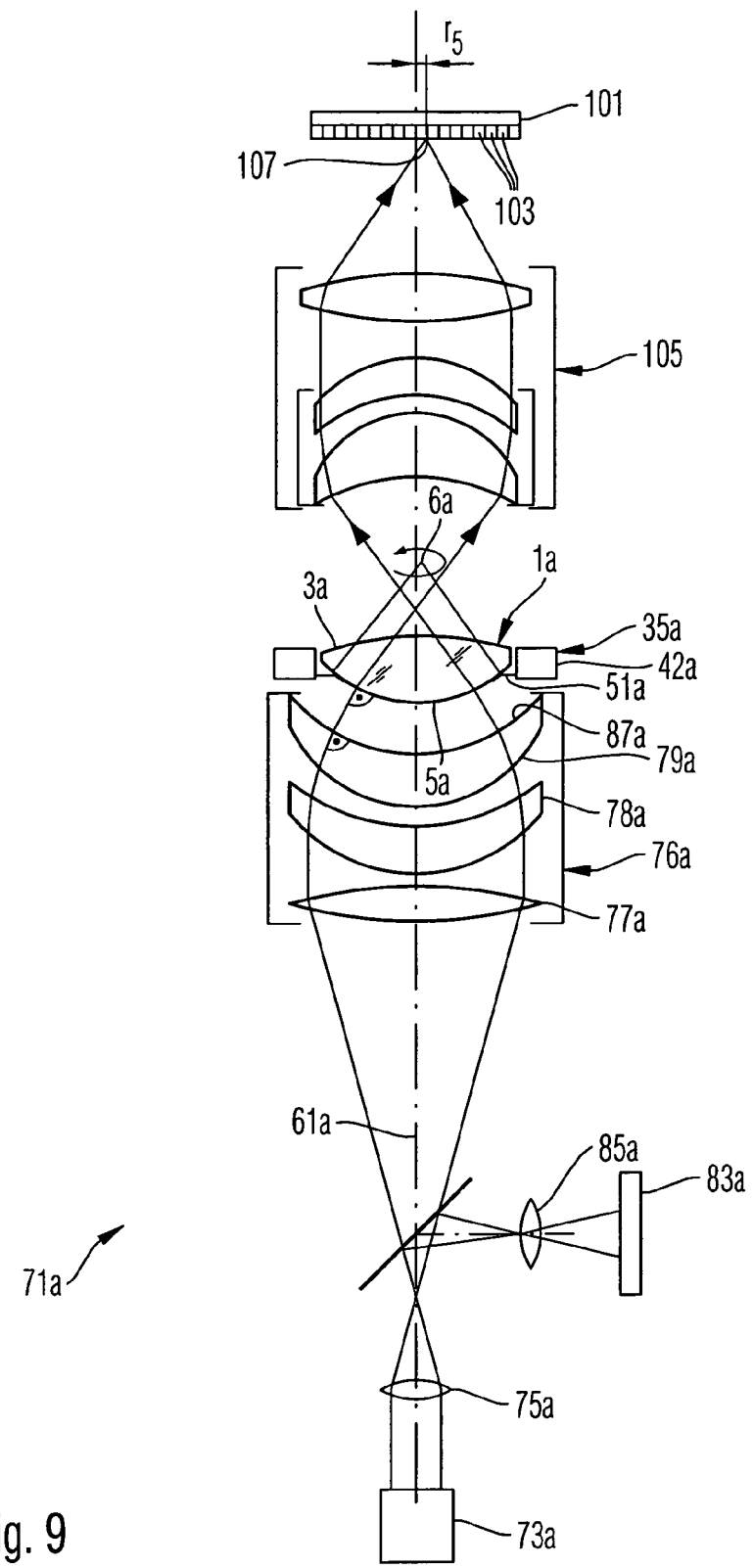
FIG. 9 illustrates an interferometer system used in adjusting the optical element relative to the mounting frame according to a second embodiment of the invention.

FIG. 9 illustrates a further interferometer system for performing the alignment method illustrated with reference to FIG. 5 above. The system shown in FIG. 9 uses only one interferometer 71a for measuring lower surface 5a of lens 1. Since only a portion of the measuring light of interferometer 71a is reflected back from surface 5a, another portion of the measuring light will traverse surface 5a and will be refracted by upper surface 3a of lens 1. The refracted light is collimated by a collimating optics 105 to be focused on a position sensitive detector 101 having an array of detector elements or pixels 103.

The interferometric measurements obtained with interferomter 71a at plural rotary positions of rotary table 59 about axis 61a of rotation thereof by detecting the interference patterns with detector 83a are analysed, and a distance of center 6a of curvature of surface 5a from axis 61a of rotation is calculated as illustrated above with reference to FIGS. 5 and 6. While rotating the lens 1a on the rotary table, also a focus 107 of the light refracted by surface 3a will be displaced on the surface of detector 101. From this moving focus 107 it is possible to determine a distance $r_5$ of the focus 107 from axis 61a of rotation, and the values of $r_5$ and the values $r_6$ of the distances of the center 6a of curvature of surface 5a from axis 61a are used for orienting the axis of symmetry of lens 1a relative to the axis 61a of rotation of the rotary table as illustrated above.

Summarized, a method of manufacturing an optical system comprises assembling an optical element on a mounting frame thereof. The mounting frame is disposed on a rotary table having an axis of rotation, and the mounting frame is adjusted such that a predefined axis of symmetry thereof is parallel to the axis of rotation. The optical element is placed on the mounting frame, and an interferometric measurement of a surface of the optical element is performed. The interferometric measurement is analyzed to arrange the optical element relative to the mounting frame such that a predefined axis of the optical element is parallel to the axis of rotation.

The present invention has been described by way of exemplary embodiments to which it is not limited. Variations and modifications will occur to those skilled in the art without departing from the scope of the present invention as recited in the appended claims and equivalents thereof.

The invention claimed is:

1. A method of manufacturing an optical system, the method comprising assembling a first unit of an optical element and a mounting frame by:
disposing the mounting frame on a rotary table, wherein the rotary table is rotatable about an axis of rotation, and wherein the mounting frame has a body portion having a predefined first axis of symmetry;
adjusting a position of the mounting frame relative to the rotary table such that the first axis of symmetry of the body portion of the mounting frame is substantially parallel to the axis of rotation of the rotary table;
placing the optical element on the mounting frame such that supporting portions of the mounting frame are in contact with the optical element, the optical element having a first main optical surface and a predefined second axis of symmetry;
rotating the rotary table into plural different rotational positions about the axis of rotation and performing at least one interferometric measurement of the first main optical surface at each of the plural rotational positions;
adjusting a position of the optical element relative to the mounting frame such that the second axis of symmetry of the optical element is substantially parallel to the axis of rotation of the rotary table, wherein the adjusting is performed in dependence on a result of the plural interferometric measurements; and
fixing the position of the optical element relative to the mounting frame.

2. The method according to claim 1, wherein a measuring beam used in the plural interferometric measurements is incident on a portion of the measured first main optical surface which has an area which is greater than about 50% of a total area of the first main optical surface.

3. The method according to claim 1, further comprising determining a distance between the first axis of symmetry of the body portion and the second axis of symmetry of the optical element.

4. The method according to claim 3, further comprising determining at least one of:
a first value representing an orientation of the second axis of symmetry of the optical element relative to the body portion about the first axis of symmetry of the body portion of the mounting frame; and
a second value representing an orientation of the first axis of symmetry of the body portion relative to the optical element about the second axis of symmetry of the optical element.

5. The method according to claim 1, wherein the adjusting of the position of the mounting frame relative to the rotary table comprises adjusting the position of the mounting frame relative to the rotary table such that the first axis of symmetry of the body portion of the mounting frame substantially coincides with the axis of rotation of the rotary table.

6. The method according to claim 1, wherein the first main surface has a substantially spherical shape.

7. The method according to claim 6, wherein the supporting portions of the mounting frame are in contact with the first main optical surface when the optical element is placed on the mounting frame.

8. The method according to claim 7, wherein the rotating of the rotary table and performing the at least one interferometric measurement comprises performing at least one interferometric measurement of the first main optical surface of the optical element.

9. The method according to claim 8, wherein the adjusting of the position of the optical element relative to the mounting frame comprises determining a third value corresponding to a distance of a center of curvature of the first main optical surface from the axis of rotation, wherein the adjusting of the position of the optical element relative to the mounting frame is further performed in dependence on the determined value.

10. The method according to claim 6, wherein the optical element has a second main optical surface of a substantially spherical shape, wherein the rotating of the rotary table and performing the at least one interferometric measurement comprises performing at least one interferometric measurement of the first main optical surface and performing at least one interferometric measurement of the second main optical surface.

11. The method according to claim 10, wherein the adjusting of the position of the optical element relative to the mounting frame comprises determining a value corresponding to a distance of a center of curvature of the first main optical surface from the axis of rotation, and determining another value corresponding to a distance of a center of curvature of the second main optical surface from the axis of rotation, wherein the adjusting of the optical element relative to the mounting frame is further performed such that said value and said another value are substantially equal.

12. The method according to claim 1, wherein the performing of the at least one interferometric measurement comprises superimposing measuring light reflected from the first main optical surface with reference light.

13. The method according to claim 12, further comprising: focusing measuring light having traversed the first main optical surface onto a position sensitive detector.

14. The method according to claim 1, further comprising: assembling the first unit with a second unit having an optical element fixed to the mounting frame.

15. The method according to claim 14, wherein the assembling of the first unit with the second unit comprises adjusting a position of the second unit relative to the first unit such that an axis of symmetry of the optical element of the second unit substantially coincides with the predefined axis of symmetry of the optical element of the first unit.

16. The method according to claim 15, wherein the assembling of the first unit with the second unit comprises fixing the position of the second unit relative to the first unit.

* * * * *

UNITED STATES PATENT AND TRADEMARK OFFICE
CERTIFICATE OF CORRECTION

| | | |
|---|---|---|
| PATENT NO. | : 7,133,225 B1 | Page 1 of 1 |
| APPLICATION NO. | : 10/965909 | |
| DATED | : November 7, 2006 | |
| INVENTOR(S) | : Rolf Freimann et al. | |

It is certified that error appears in the above-identified patent and that said Letters Patent is hereby corrected as shown below:

Column 10, claim 9, line 16, delete the word "third".

Signed and Sealed this

Twenty-seventh Day of March, 2007

JON W. DUDAS
*Director of the United States Patent and Trademark Office*